United States Patent [19]

Roberts et al.

[11] Patent Number: 4,812,751

[45] Date of Patent: Mar. 14, 1989

[54] APPARATUS FOR MONITORING EARTH FAULTS ON THE ROTOR WINDING OF A GENERATOR

[75] Inventors: Ian A. Roberts, Horsham; Colin Hargis, Bristol, both of United Kingdom

[73] Assignee: The Central Electricity Generating Board, London, England

[21] Appl. No.: 869,774

[22] Filed: Jun. 2, 1986

[51] Int. Cl.⁴ .................. G01R 31/06; G08B 21/00
[52] U.S. Cl. ................................ 324/546; 324/522; 324/510; 340/648; 340/650
[58] Field of Search .................. 340/646–648, 340/650, 679; 361/23, 31, 33, 35, 36, 42; 324/509, 510, 512, 522–525, 527, 545–547, 551, 557, 158 MG

[56] References Cited

U.S. PATENT DOCUMENTS

| 880,565 | 3/1908 | Nicholson | 324/52 |
| 2,627,540 | 2/1953 | Rich | 324/51 |
| 3,947,759 | 3/1976 | Briggs | 324/51 |
| 4,187,525 | 2/1980 | Nagura et al. | 361/42 |

Primary Examiner—Reinhard J. Eisenzopf
Assistant Examiner—Jack B. Harvey
Attorney, Agent, or Firm—Antonelli, Terry & Wands

[57] ABSTRACT

It is known to detect a single breakdown of the electrical insulation separating the rotor winding from the earthed rotor body of a generator: such a failure does not lead to intense arcing, however, as there is no return path for current flowing to earth. Disclosed is a potential divider network which allows continuous monitoring of the voltages between earth and the two ends of the winding: a second breakdown can be rapidly detected since it results in a shift in both the position and magnitude of the effective resistance to earth from that associated with the first breakdown.

12 Claims, 3 Drawing Sheets

(a) SWITCH OPEN (b) SWITCH CLOSED (TO A)

APPARATUS FOR MONITORING EARTH FAULTS ON THE ROTOR WINDING OF A GENERATOR

BACKGROUND OF THE INVENTION

This invention relates to apparatus for monitoring earth faults on an exciter winding on the rotor of a generator and is concerned more particularly with monitoring faults on rotor windings of large turbogenerators such as are employed by utilities in large power stations.

The d.c. supply to the rotor winding of large turbogenerators is derived (in the majority of cases) from an a.c. machine whose shaft is mechanically coupled to the rotor at the slip ring end, the 3-phase output being rectified by a static full-wave diode bridge. This is fully insulated from earth or ground and thus normally the combination of a.c. machine/rectifier bridge/rotor winding (hereafter referred to as the excitation system) floats relative to earth with an insulation resistance of more than 10 MΩ.

Occasionally the insulation resistance to earth (rotor body) falls. This can be caused by a variety of mechanisms, for example the build up of brush dust around the slip rings, the presence of steam in the area of the rectifier cubicle or potentially more serious the degradation of the rotor insulation itself. Since the excitation system floats, the existence of a single insulation defect is not in itself sufficient to cause damage, as there is no return path for current flowing to earth. However if a second defect occurs current can flow between the defects via the rotor body (say) shunting a section of the rotor winding. If a significant proportion of the rotor current is diverted through the rotor body, the potential damage that can be caused is very high because of localised heating of the defect sites. This may take the form of an intense arc between the winding and rotor body, and molten copper and steel will be thrown out from the rotor by centrifugal action.

Most large turbogenerators nowadays are fitted with rotor "earth leakage" alarm equipment. Such equipment makes use of a low voltage d.c. supply which is used to bias the whole excitation system with respect to earth. If the insulation resistance at any point in the winding falls, there will be an increase in the leakage current flowing in the bias circuit. A replay is provided which operates at a predetermined level of this leakage current to give an alarm signal. The absolute magnitude of the current in such a circuit will depend not only on the resistance of the defect or defects and on the exciter voltage but also on the position of the defect or defects in the winding. The circuit would normally be arranged so that, on receipt of the first alarm, the insulation resistance is still sufficiently high that the rotor winding is not yet at significant risk. It will be appreciated that it may be several years from the first indication of low insulation resistance until the final failure of the rotor winding. Thus, when such an alarm is received, tests are made to check the validity of the alarm. If the fault is confirmed and economic reasons dictate continued operation of the equipment, then the problem arises of a second defect occurring as discussed above. The present invention is directed to this problem. It is envisaged that, if a conventional "earth leakage" alarm circuit gives an alarm signal and the equipment is to continue in use, then the apparatus of the present invention will be fitted.

BRIEF SUMMARY OF THE INVENTION

According to the present invention apparatus for monitoring earth faults on an exciter winding on the rotor of a generator comprises switch means arranged for selectively opening and closing a connection, via a resistive impedance, between the earthed rotor and at least one of the ends of said winding, means determining the voltages $V_1$ and $V_2$ respectively between earth and the two ends of the winding, and logic means responsive to the determined voltages $V_1$ and $V_1$ arranged for providing an indication and/or alarm and/or record of the defect position represented by the ratio of $V_1$ to $(V_1+V_2)$ when the switch is open circuit and/or the defect current and/or the defect voltage and/or the fault resistance.

The primary purpose of the monitor is to provide an immediate indication and/or alarm signal to detect if a second defect occurs. If such a defect occurs, the alarm signal may be used automatically to trip the generator if the fault is serious. The continuous monitoring of the fault condition more generally may be used to assist in the prediction of the remaining rotor life from the monitored parameters.

BRIEF DESCRIPTION OF THE DRAWINGS

In the following description, reference will be made to the accompanying drawings in which.

DETAILED DESCRIPTION

Figure 1:
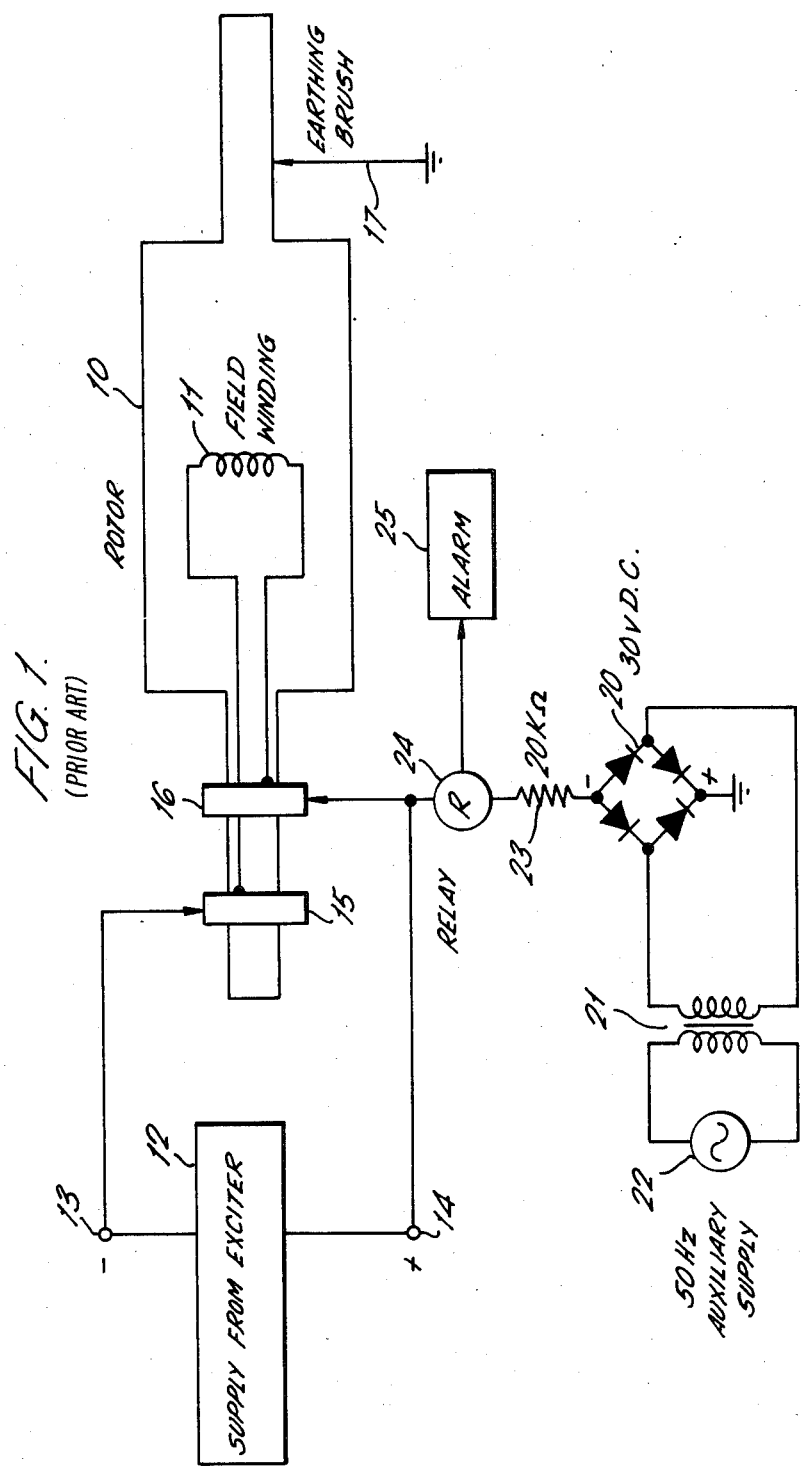
FIG. 1 illustrates diagrammatically a rotor such as might be used in a large turbogenerator and having a field winding provided with a known form of rotor earth leakage alarm.

Referring to FIG. 1 there is shown diagrammatically a rotor 10 with a field winding 11 which is energised with a steady state d.c. supply from a source indicated diagrammatically at 12, the d.c. supply being applied via input terminals 13, 14 and slip rings 15, 16 to the respective ends of the winding 11. The rotor itself, in the known way, is earthed or grounded means of an earthing brush indicated diagrammatically at 17.

A common arrangement of rotor earth leakage alarm is illustrated diagrammatically in FIG. 1. A low voltage d.c. supply for biasing the whole excitation system with respect to earth is provided by a full-wave rectifier 20 for rectifying an output from a transformer 21 connected to a 50 Hz auxiliary supply 22. The d.c. voltage which might typically be 30 volts is applied via a measuring resistor 23 and relay winding 24 to one end of the field winding 11 via one of the aforementioned slip rings 15, 16. The relay is arranged to operate at a predetermined level of the leakage current. The actual magnitude of the relay current depends on the position of the defect or defects in the winding, the resistance of the defect or defects, and the supply voltage, and the relay will be set to operate at a level at which the insulation resistance is still sufficiently high that there is no significant risk. Thus the generator can be allowed to continue to operate.

It is envisaged that, employing the apparatus of the present invention, when such a fault is confirmed, the leakage alarm equipment shown in FIG. 1 should be replaced by the monitoring equipment of the present invention which will give a continuous monitor of the fault condition and which can be arranged to trip the generator in the event of any serious multiple earth fault.

Figure 2:
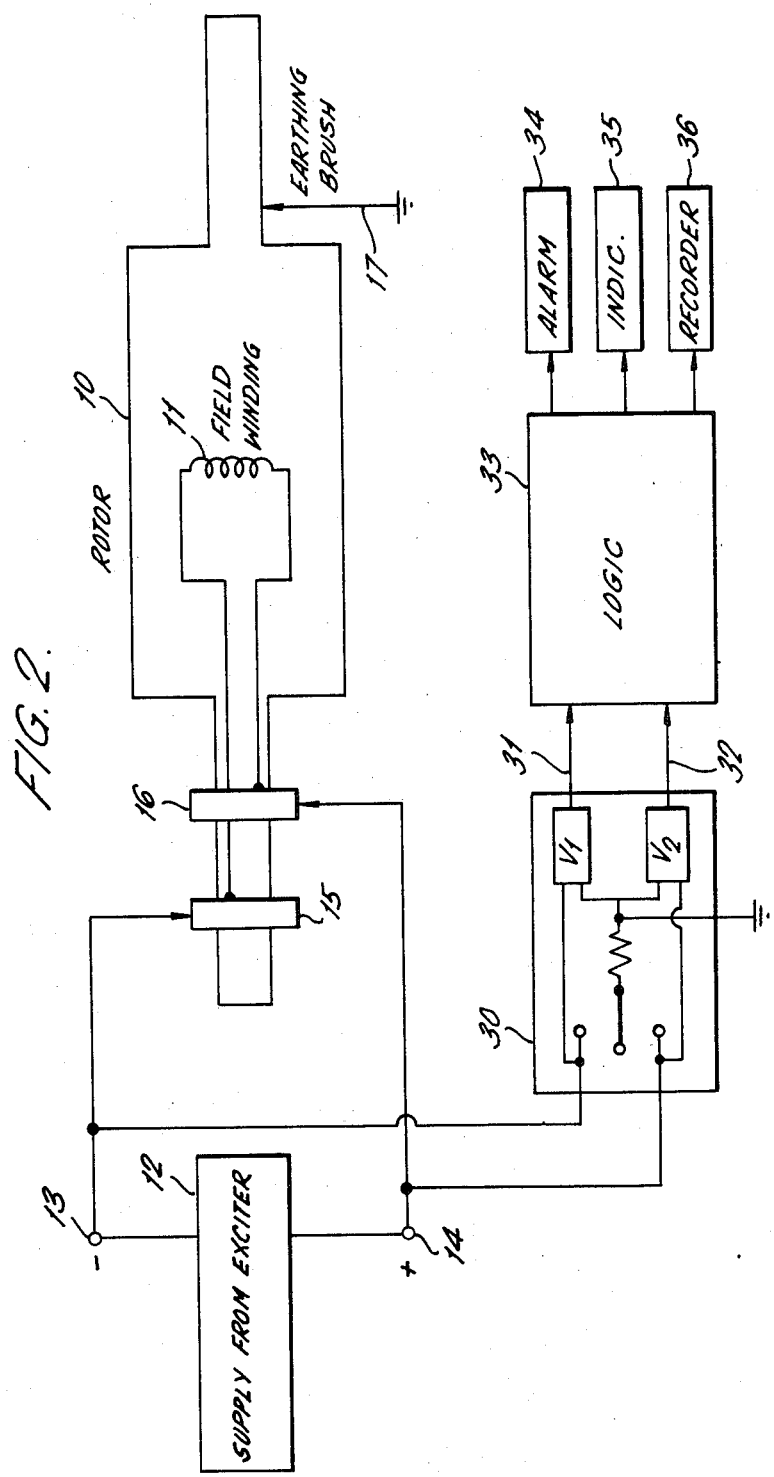
FIG. 2 is a diagram similar to FIG. 1 but illustrating the rotor with the monitoring equipment of the present invention.

FIG. 2 ilustrates the rotor 10 with its field winding 11 and exciter supply 12, 13, 14 and provided with one embodiment of the monitoring equipment of the present invention.

Referring to FIG. 2 there is shown diagrammatically a measurement unit 30 providing outputs on lines 31, 32 representative of the aforementioned voltages $V_1$ and $V_2$ which outputs are fed to a logic unit 33 for controlling an alarm 34 and/or an indicator 35 and/or a recorder 36. The logic unit 33 may also be arranged to provide a trip signal to trip the generator in the event of a serious multiple earth fault. FIG. 2 is a diagrammatic drawing and omits the provision, in the known manner, of suitable high voltage isolation of the measuring equipment from the generator rotor circuit.

Figure 3:
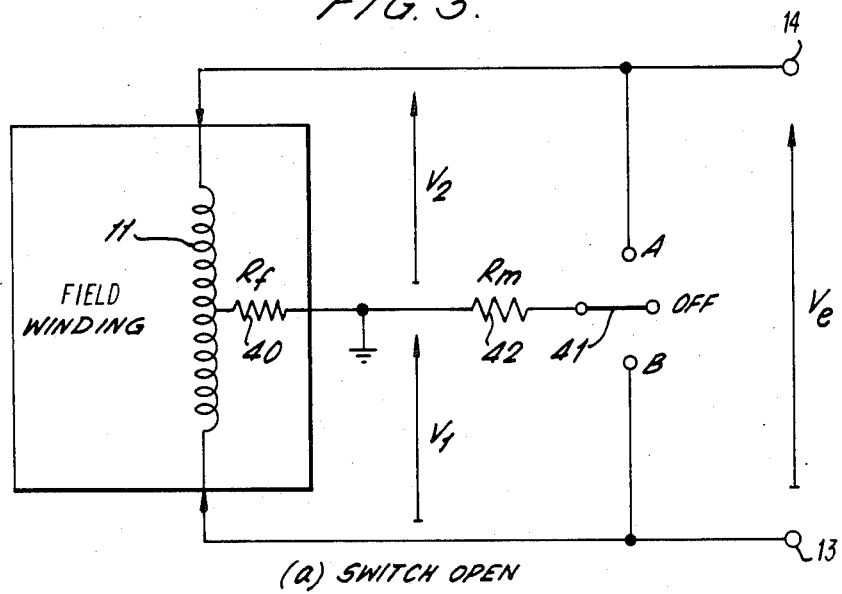
FIGS. 3 and 4 are simplified circuit diagrams of part of the monitoring equipment of the present invention showing a switch in two alternative positions.
Figure 4:
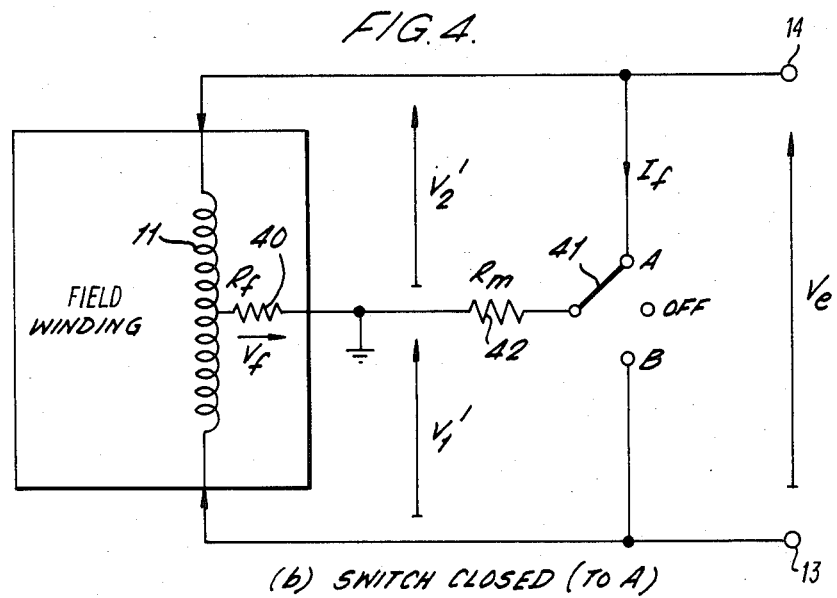

The operation of the monitor equipment will be explained with reference to the diagrammatic drawings of FIGS. 3 and 4 which show the principal parts of the measuring circuit diagrammatically. Referring to FIG. 3 the field winding 11 is shown connected to the exciter terminals 13, 14. The insulation or fault resistance is represented by a single resistance 40 of magnitude $R_f$ between a point on the rotor winding 1 and earth. The measuring circuit has a switch with a movable contact 41 connected via a measuring resistor 42 to earth. The switch has a central open circuit position and two further positions, marked A and B in FIGS. 3 and 4 in which the measuring resistor 42 is connected by contact 41 alternatively to one or other end of the field winding 11.

With the switch open as shown in FIG. 3, i.e. no current flowing in the fault resistance $R_f$ then the defect position K (K is defined as the fractional position up the winding from the negative slip ring) is given by:

$$K = \frac{V_1}{V_1 + V_2} \quad (1)$$

where $V_1$ and $V_2$ are the measured voltages between the ends of the winding and earth. If the switch is now closed to position A (FIG. 4) the voltages $V_1$ and $V_2$ will change from those values observed previously; the amount of the change is determined by the current flowing $I_f$ and the insulation resistance $R_f$.

Now the "apparent" fault position K' will be given by:

$$K' = \frac{V_1'}{V_1' + V_2'} \quad (2)$$

where the primes denote the quantities observed when the switch is closed. The apparent change in fault position $\Delta K$ is:

$$\Delta K = K' - K = \left(\frac{V_1'}{V_1' + V_2'}\right) - \left(\frac{V_1}{V_1 + V_2}\right) \quad (3)$$

From this the voltage $V_f$ across the fault resistance $R_f$ can be deduced:

$$V_f = \Delta K \, V_e = \Delta K \, (V_1' + V_2') \quad (4)$$

and the current $I_f$ flowing in the fault resistance $R_f$ is:

$$I_f = \frac{V_2'}{R_m} \quad (5)$$

Thus the fault resistance $R_f$ is equal to:

$$R_f = \frac{V_f}{I_f} \quad (6)$$

The calculated value of $R_f$ is thus unaffected by excitation voltage changes between the two measurements.

If several defects exist the calculated resistance to earth will be that of all the defect resistances in parallel (i.e. true insulation resistance) and the position deduced is that of the calculated equivalent resistance.

The measuring resistor $R_m$ could be connected to either end of the rotor winding. If the switch is closed to position B instead of A, $\Delta K$ will be negative as will the current $I_f$ in equation (5) which becomes $$I_f = \frac{V_1'}{R_m} \quad (7)$$

Equation (6) in then valid as before.

The choice of end connection is governed by the initial fault position, the object being to optimize the measurement of $R_f$. Clearly for a fault at K=1 (+ve end of the winding) closing the switch to A will have no effect, $I_f$ will be zero and no calculation of $R_f$ can be made. Closing to B on the other hand will yield a sensible result. Thus, connection should be made to the end which is at the highest potential to earth.

Practical experience has shown that the smallest consistently resolvable value of $\Delta K$ is about 0.01. With a 20 kΩ measuring resistor $R_m$ this implies a lower limit of insulation resistance measurement of 400Ω for a fault in the centre of the winding.

The smallest accurately measurable values of $V_1'$ or $V_2'$ are about 1% of the normal excitation voltage. This implies an upper limit of insulation resistance measurement of 1 MΩ for the same conditions as above.

Provision may be made for the manual insertion of different values of measuring resistor $R_m$ to cover other ranges of insulation resistance measurement.

The switch 41 is cyclically operated either through all three positions or between the central position and a selected one of the end positions chosen as described above. It will be understood that the switch may be a solid-state device.

The shorter the measuring cycle the quicker a fault condition will be detected. However, in practice the time required for capacitive effects to decay may be up to ¾ second when the switch is open. Thus a measuring period of one second is proposed with a 0.75:0.25 duty cycle of the relay. An incidental to this is that the average dissipation in the defect is reduced to a quarter of its maximum value. Time variation is sometimes observed for several seconds after the switch closure, presumably due to thermal and/or electrochemical effects. There is no reason however to wait for the measurement to settle in this case, but it is important that the interval between closing the switch and making the measurement be consistent.

The equipment described above will constantly monitor the calculated values of fault resistance $R_f$ and position K and initiate alarm trip signals as the resistance $R_f$ falls below preselected values with due regard to the deviation of K from a reference (first fault) position.

We claim:

1. Apparatus for monitoring ground faults on an exciter winding on a grounded rotor of a generator comprising a resistive impedance, switch means arranged for selectively opening and closing a connection connecting the resistive impedance between the grounded rotor and at least one of the ends of the winding, means for determining voltages $V_1$ and $V_2$ respectively between ground and the two ends of the winding, and logic means responsive to the determined voltages $V_1$ and $V_2$ for providing an indication of the fault position, represented by the ratio of $V_1$ to $(V_1+V_2)$ when the switch is in an open circuit position.

2. Apparatus as claimed in claim 1 wherein the switch means comprises means for cyclically connecting the resistive impedance alternately to an open circuit position and to a selected end of the winding.

3. Apparatus as claimed in claim 1 wherein the switch means comprises means for cyclically connecting the resistive impedance to the two ends of the winding with an open circuit period after each period of connection to an end of the winding.

4. Apparatus as claimed in claim 1 wherein said logic means includes means for determining, with the switch in the open circuit position, a ratio K of $V_1$ to $(V_1+V_2)$ and for determining, with the switch connected to one end of the winding, a changed value K' of this ratio and then determining the difference $\Delta K$ between K' and K.

5. Apparatus as claimed in claim 4 wherein the logic means includes means for determining the fault voltage $V_f$ from the product of $\Delta K$ and $(V_1'+V_2')$, where $V_1'$ and $V_2'$ are the respective voltages when said switch is connected to the respective ends of the winding.

6. apparatus as claimed in claim 5 wherein the logic means includes means for determining a fault current $I_f$ from the determined voltage $V_2'$ and the magnitude $R_m$ of the resistive impedance.

7. Apparatus as claimed in claim 6 wherein the logic means includes means for determining a fault resistance $R_f$ from the ratio of $V_f$ to $I_f$.

8. Apparatus as claimed in claim 1 wherein the logic means provides an alarm indicative of a fault.

9. Apparatus as claimed in claim 1 wherein the logic means provides a record indicative of the fault position.

10. Apparatus as claimed in claim 1 wherein the logic means provides an indication of the fault current.

11. Apparatus as claimed in claim 1 wherein the logic means provides an indication of the fault voltage.

12. Apparatus as claimed in claim 1 wherein the logic means provides an indication of the fault resistance.

* * * * *